US008436460B1

(12) United States Patent
Gamboa et al.

(10) Patent No.: US 8,436,460 B1
(45) Date of Patent: May 7, 2013

(54) MULTIPLE DIE PADDLE LEADFRAME AND SEMICONDUCTOR DEVICE PACKAGE

(75) Inventors: Carlo Gamboa, Milpitas, CA (US); Bo Chang, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 529 days.

(21) Appl. No.: 11/894,513

(22) Filed: Aug. 20, 2007

Related U.S. Application Data (60) Provisional application No. 60/927,735, filed on May 4, 2007.

(51) Int. Cl.
*H01L 23/48* (2006.01)

(52) U.S. Cl.
USPC .................. 257/692; 438/123; 257/E23.031

(58) Field of Classification Search .......... 257/666–677, 257/E23.004, E23.06–E23.077, E25.001–E25.032, 257/692, 698, E21.51; 438/123
See application file for complete search history.

(56) References Cited

U.S. PATENT DOCUMENTS

| | | | |
|---|---|---|---|
| 6,169,322 B1 * | 1/2001 | Chang et al. ................. | 257/663 |
| 2004/0061202 A1 * | 4/2004 | Shim et al. ................... | 257/666 |
| 2005/0056920 A1 * | 3/2005 | Li et al. ....................... | 257/686 |
| 2005/0073018 A1 * | 4/2005 | Yano et al. ................... | 257/433 |
| 2005/0253230 A1 * | 11/2005 | Punzalan et al. .............. | 257/678 |
| 2006/0104328 A1 * | 5/2006 | Crews ....................... | 372/50.124 |
| 2007/0052076 A1 * | 3/2007 | Ramos et al. ................ | 257/676 |

* cited by examiner

*Primary Examiner* — Julio J Maldonado
*Assistant Examiner* — Sonya D McCall Shepard (57) ABSTRACT

A leadframe and semiconductor device package with multiple semiconductor device die paddles for accepting multiple semiconductor devices is disclosed, wherein the leadframe increases semiconductor device density and reduces cost by integrating the multiple dies into a semiconductor device package with a relatively small footprint. The leadframe may include at least one full-metal die paddle and at least one reduced-metal die paddle, which may form a unified or hybrid die paddle. The leadframe may enable electrical coupling of multiple semiconductor devices to a common leadfinger and/or die paddle, where internal leadfingers coupled to the common leadfingers and/or die paddles may receive the electrical coupling means from the semiconductor device. Surfaces of one or more die paddles of the leadframe may be exposed to the outside of the semiconductor device package to enable electrical testing of and/or provide heat dissipation from one or more of the semiconductor devices attached to the leadframe.

15 Claims, 7 Drawing Sheets

MULTIPLE DIE PADDLE LEADFRAME AND SEMICONDUCTOR DEVICE PACKAGE

RELATED APPLICATIONS

The present application is related to and claims the benefit of U.S. Provisional Patent Application Ser. No. 60/927,735, filed May 4, 2007, entitled "MULTI-DIE PADDLE LEADFRAME FOR INTEGRATED OPTICAL SENSOR SYSTEM," naming Bo Chang and Carlo Gamboa as inventors, assigned to the assignee of the present invention. That application is incorporated herein by reference in its entirety and for all purposes.

BACKGROUND OF THE INVENTION

As the capabilities and features of consumer products increase, the number and density of the components used in the products also increases. Additionally, the complexity of each component used in the products increases to carry out the enhanced functionality of the product. As such, size and cost requirements for the products tend to limit product functionality. Further, the increased number, density and complexity of components increases the overall heat generated by the products, thereby presenting additional issues for the design of these products.

For example, a conventional optical sensor unit used in optical mice and similar multi-die products utilizes multiple integrated circuits to detect movement of the product and provide input to computer systems. Each of the integrated circuits is mounted to a printed circuit board (PCB) or a laminate substrate, which is then incorporated into the product during manufacture. As such, conventional multi-die systems have a relatively large package footprint, thereby limiting integrated circuit density and making them unsuitable for use in higher-performance applications. Additionally, product functionality is further limited by the use of PCB or laminate substrates which provide a relatively high product and assembly cost and poor heat dissipation for heat-generating components.

SUMMARY OF THE INVENTION

Accordingly, a need exists for multi-die systems that are smaller and less expensive to produce. More specifically, a need exists for an optical sensor unit which is smaller yet provides increased component density. A need also exists for optical sensor units with reduced product and assembly cost. Additionally, a need exists for an optical sensor unit with improved heat dissipation for heat-generating components. Embodiments of the present invention provide novel solutions to these needs and others as described below.

Embodiments of the present invention are directed to a leadframe and semiconductor device package with multiple semiconductor device die paddles for accepting multiple semiconductor devices, wherein the leadframe increases semiconductor device density and reduces cost by integrating the multiple dies into a semiconductor device package with a relatively small footprint. The leadframe may include at least one full-metal die paddle (e.g., with a surface area larger than that of a semiconductor device mounting surface) and at least one reduced-metal die paddle (e.g., with a surface area smaller than that of a semiconductor device mounting surface), where the full-metal die paddle and the reduced-metal die paddle may form a unified or hybrid die paddle in one embodiment.

The reduced-metal die paddle may be used to reduce the spread of die attach material used to bond the semiconductor device to the reduced-metal die paddle, thereby reducing the amount of die attach material which may short or otherwise interfere with conductive regions of the semiconductor device. Additionally, the leadframe may enable electrical coupling of multiple semiconductor devices to a common leadfinger and/or die paddle, where internal leadfingers coupled to the common leadfingers and/or die paddles may receive the electrical coupling means (e.g., wire bonding, etc.) from the semiconductor device. Further, surfaces of one or more die paddles of the leadframe may be exposed to the outside of the semiconductor device package to enable electrical testing of (e.g., functional verification, etc.) and/or provide heat dissipation from (e.g., by attaching a heatsink to the exposed surface, etc.) one or more of the semiconductor devices attached to the leadframe.

In one embodiment, a leadframe includes a full-metal die paddle for accepting a first semiconductor device. The leadframe also includes a reduced-metal die paddle for accepting a second semiconductor device. A plurality of leadfingers is also provided for coupling to conductive pads of first and second semiconductor devices. In one embodiment, the reduced-metal die paddle includes a plurality of adjoining circular portions. The leadframe may include at least one additional die paddle including a first surface for accepting an additional semiconductor device and a second surface for performing electrical testing of the additional semiconductor device. Additionally, the full-metal die paddle may include a surface for providing heat dissipation from the first semiconductor device.

In another embodiment, a multi-die semiconductor device package includes a first semiconductor device, a second semiconductor device, and a leadframe. The leadframe includes a full-metal die paddle for accepting the first semiconductor device, a reduced-metal die paddle for accepting the second semiconductor device, and a plurality of leadfingers for coupling to conductive pads of the first and second semiconductor devices. The leadframe may also include at least one additional die paddle including a first surface for accepting a semiconductor device and a second surface for performing electrical testing of the additional semiconductor device. The additional semiconductor device may be electrically coupled to at least two die paddles with respective surfaces for performing electrical testing of the additional semiconductor device.

In yet another embodiment, a multi-die optical sensor system includes a plurality of semiconductor devices associated with optical sensing. The multi-die optical sensor system also includes a leadframe including a plurality of die paddles for accepting the plurality of semiconductor devices. The leadframe also includes a plurality of leadfingers for coupling to conductive pads of the plurality of semiconductor devices. At least one of the plurality of semiconductor devices may be for emitting light and/or sensing light for use in the optical sensing. Additionally, at least one of the plurality of semiconductor devices may include a zener diode, an analog die, and/or a digital die. Additionally, at least one die paddle of the plurality of die paddles includes a first surface for accepting at least one of the plurality of semiconductor devices and a second surface for performing electrical testing of the at least one of the plurality of semiconductor devices. And in one embodiment, at least one die paddle of the plurality of die paddles includes a surface for providing heat dissipation from a coupled semiconductor device.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the Invention

Figure 1:
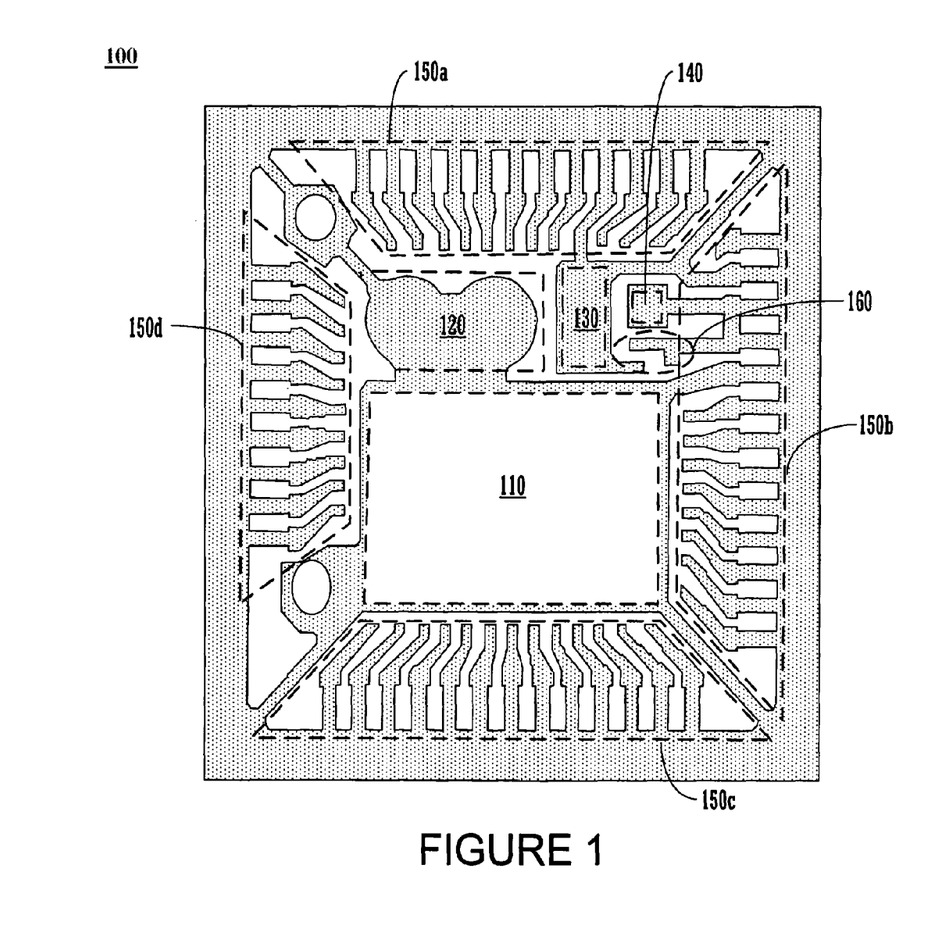
FIG. 1 shows an exemplary leadframe with multiple die paddles in accordance with one embodiment of the present invention.

FIG. 1 shows exemplary leadframe 100 with multiple die paddles in accordance with one embodiment of the present invention. As shown in FIG. 1, leadframe 100 comprises full-metal die paddle (FMDP) 110 and reduced-metal die paddle (RMDP) 120 (e.g., comprising a plurality of adjoining circular portions which also adjoin FMDP 110). Leadframe 100 also comprises additional die paddles 130 and 140. In one embodiment, each of die paddles 110-140 may accept a respective semiconductor device or "die," where each semiconductor device may be attached to the die paddle using a die attach material (e.g., conductive, non-conductive, etc.) or the like. In this manner, a multi-die system may be produced. In other embodiments, one or more of die paddles 110-140 may accept more than one semiconductor device, or alternatively, one or more of die paddles 110-140 may be left vacant and not coupled to a semiconductor device.

FMDP 110 may comprise a surface area larger than a respective mounting surface of a semiconductor device mounted thereto. As such, a semiconductor device deposed on FMPD 110 may not overhang FMDP 110 in one embodiment.

In contrast to FMDP 110, RMDP 120 may comprise a surface area less than a respective mounting surface of a semiconductor device mounted thereto, thereby allowing the semiconductor device to overhang RMDP 120. As such, RMDP 120 may reduce the spread of die attach material used to bond the semiconductor device to the die paddle (e.g., 120). Additionally, in one embodiment, RMDP 120 may also reduce the amount of die attach material which may short or otherwise interfere with conductive regions of the semiconductor device mounted to RMDP 120. Further, RMDP 120 may comprise a 2-scoop reduced metal die paddle in one embodiment.

In one embodiment, FMDP 110 and RMDP 120 may be coupled to form a unified or hybrid die paddle (e.g., a hybrid-metal die paddle or HMDP). The HMDP may enable the use of an oversized digital die in an open-cavity package comprising leadframe 100 without compromising assembly design rules in one embodiment.

Leadframe 100 also comprises peripheral leadfingers 150a-150d for electrically coupling (e.g., using wire bonding, etc.) to semiconductor devices (not shown in FIG. 1) disposed on one or more of die paddles 110-140. As such, leadframe 100 may be used to integrate multiple semiconductor devices into an integrated system or semiconductor device package, thereby reducing part and assembly costs over conventional laminate substrate and PCB-based assemblies. Additionally, the semiconductor devices may be more closely spaced using leadframe 100, thereby decreasing the size of the overall system (e.g., related to the footprint of a semiconductor device package incorporating leadframe 100) and increasing semiconductor device density.

As shown in FIG. 1, leadframe 100 also comprises internal leadfingers 160 for coupling multiple semiconductor devices to a common portion of the leadframe (e.g., 100). For example, multiple semiconductor devices disposed on one or more of die paddles 110-140 may be coupled to one or more of internal leadfingers 160, thereby effectively coupling the semiconductor devices to one or more common leadfingers (e.g., 150a-150d) and/or one or more common die paddles (e.g., 110-140). Additionally, it should be appreciated that the semiconductor devices may couple directly to other semiconductor devices, die paddles (e.g., 110-140), leadfingers (e.g., 150a-150d), or some combination thereof, in other embodiments.

In one embodiment, leadframe 100 may be used to form an integrated optical sensor system comprising multiple dies. For example, the die paddles (e.g., 110-140) and leadfingers (e.g., 150a-150d and/or 160) may be formed and configured to comply with appropriate design rules and implement an optical sensor system for use in optical mice (e.g., used to provide input to computer systems) and similar systems. As such, in one embodiment, die paddle 130 may receive a die for emitting light (e.g., a VCSEL die for emitting laser light, etc.), FMDP 110 may receive an analog die (e.g., for sensing light reflected off a surface over which the optical mouse is moved), RMDP 120 may receive a digital die, and die paddle 140 may receive a diode (e.g., for protecting the die attached to die paddle 130, etc.). Thus, leadframe 100 may provide an integrated optical sensor system with increased semiconductor device density, reduced size, reduced cost, and other enhanced features when compared with conventional solutions.

Although FIG. 1 shows a specific number of die paddles (e.g., 110-140) and leadfingers (e.g., 150a-150d and 160), it should be appreciated that a larger or smaller number of die paddles and/or leadfingers may be used in other embodiments. Additionally, it should be appreciated that one or more die paddles (e.g., 110-140) may be alternatively configured (e.g., die paddle 110 may be configured as a reduced-metal paddle, die paddle 120 may be configured as a full-metal paddle, etc.) in other embodiments. Additionally, although leadfingers 150a-150d and 160 are depicted in FIG. 1 with a specific shape and size, it should be appreciated that one or more of the leadfingers may be alternatively shaped and/or sized in other embodiments.

Figure 2:
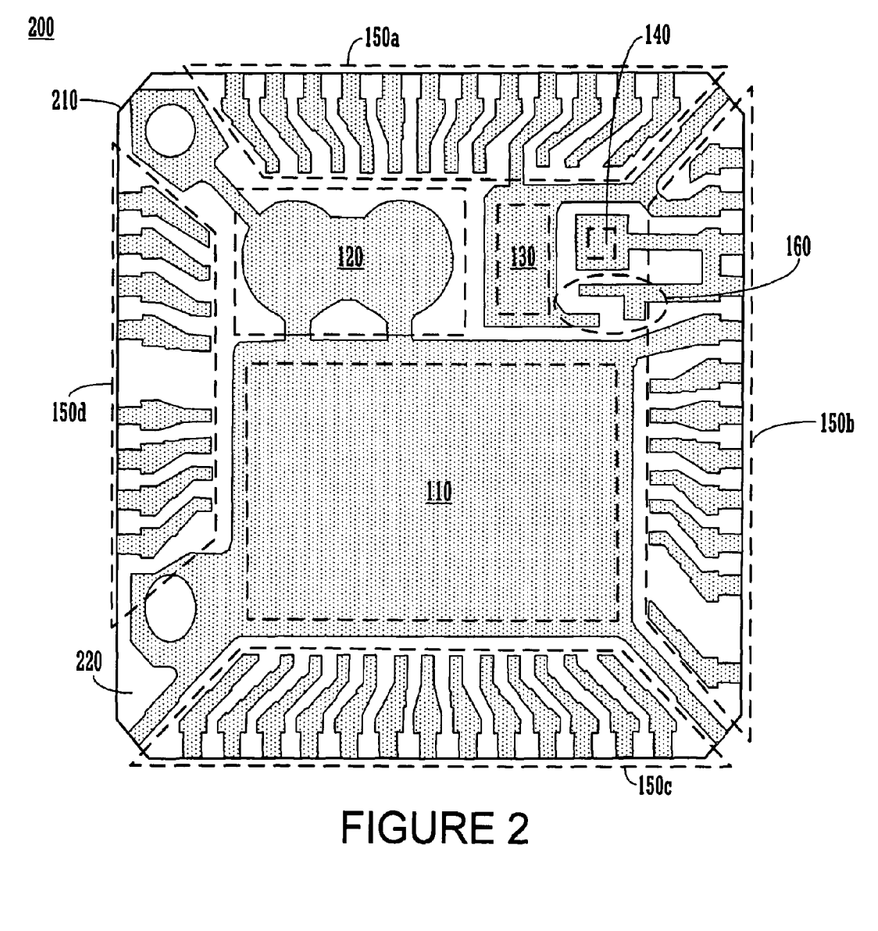
FIG. 2 shows a top view of an exemplary semiconductor device package for integrating multiple semiconductor devices in accordance with one embodiment of the present invention.

FIG. 2 shows top view 200 of exemplary semiconductor device package 210 for integrating multiple semiconductor devices in accordance with one embodiment of the present invention. As shown in FIG. 2, package 210 comprises material 220 for securing or fixing the components of leadframe 200, where material 220 may comprise a thermoset polymer (e.g., epoxy, other thermoset, etc.) in one embodiment. For example, die paddles 110-140, leadfingers 150a-150d, and leadfingers 160 may be secured or fixed with respect to one another by material 220. Leadfingers (e.g., 150a-150d), die paddles (e.g., 110-140), or other portions of leadframe 100 may be etched to increase the surface area to which material 220 is applied, thereby increasing adhesion of material 220 to leadframe 100. In one embodiment, material 220 may be applied as a co-mold to leadframe 100, where portions of leadframe 100 protruding from the package (e.g., 210) may be subsequently trimmed, formed (e.g., into leads, etc.), or otherwise modified. Additionally, package 210 may comprise an open-cavity package in one embodiment.

Figure 3:
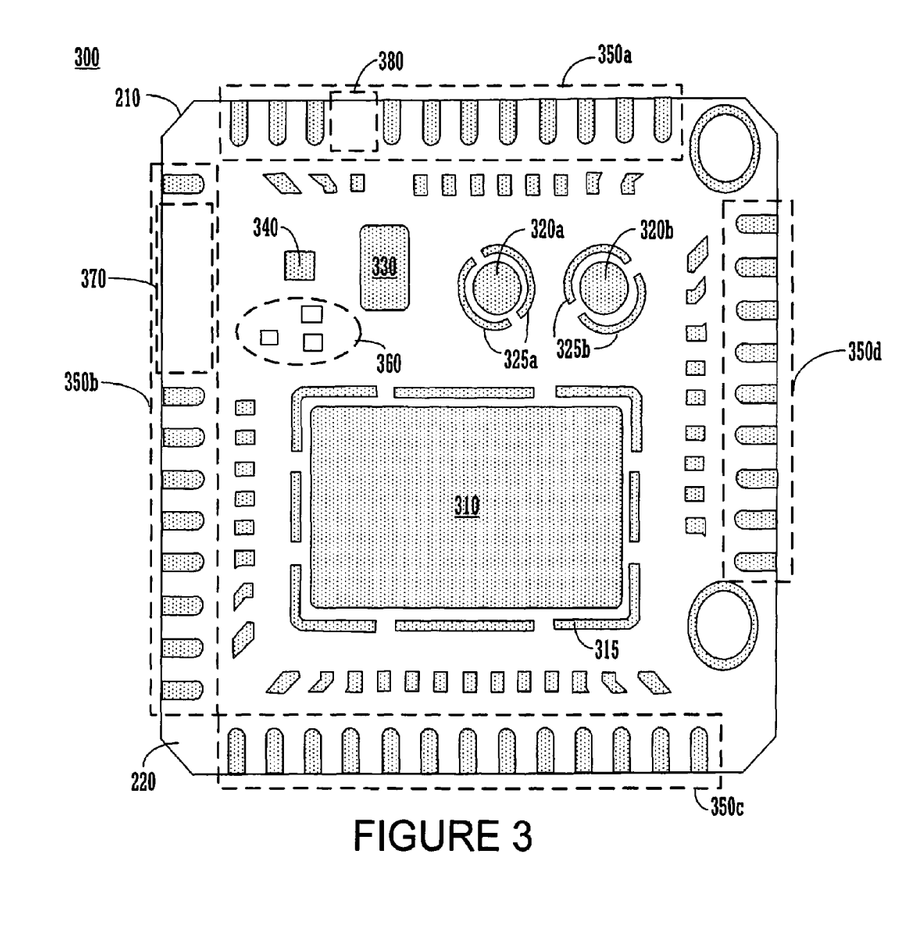
FIG. 3 shows a bottom view of an exemplary semiconductor device package for integrating multiple semiconductor devices in accordance with one embodiment of the present invention.

FIG. 3 shows bottom view 300 of exemplary semiconductor device package 210 for integrating multiple semiconductor devices in accordance with one embodiment of the present invention. As shown in FIG. 3, package 210 comprises leadfinger surfaces 350a-350d for providing electrical access to leadfingers 150a-150d and for securing package 210 to another circuit, component, device, system, etc. However, package 210 may also comprise one or more areas (e.g., 370 and 380) where material 220 covers or hides one or more leadfinger surfaces, thereby reducing or eliminating electrical access to those leadfingers.

Figure 4A:
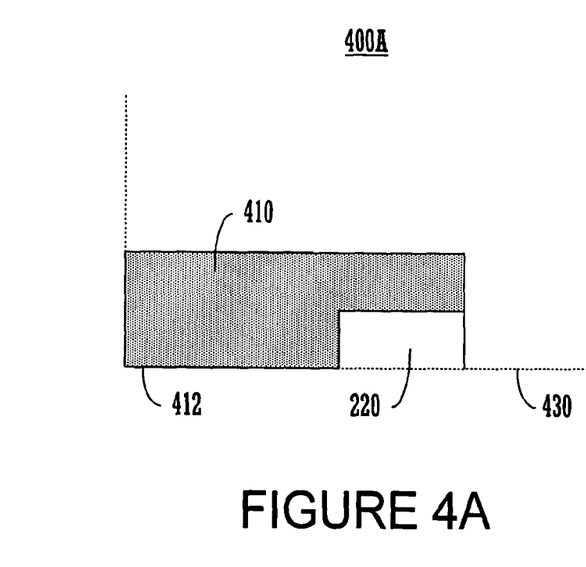
FIG. 4A shows a cross-sectional view of an exemplary leadfinger with a surface exposed to the bottom of the semiconductor device package in accordance with one embodiment of the present invention.
Figure 4B:
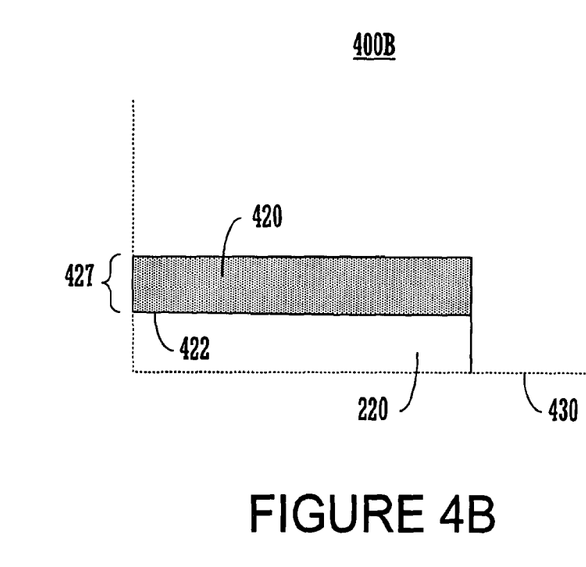
FIG. 4B shows a cross-sectional view of an exemplary leadfinger without a surface exposed to the bottom of the semiconductor device package in accordance with one embodiment of the present invention.

For example, FIG. 4A shows a cross-sectional view 400A of an exemplary leadfinger with a surface exposed to the bottom of the semiconductor device package (e.g., as represented by surfaces 350a-350d of FIG. 3) in accordance with one embodiment of the present invention, whereas FIG. 4B shows cross-sectional view 400B of an exemplary leadfinger without a surface exposed to the bottom of the semiconductor device package (e.g., as represented by areas 370 and 380 of FIG. 3) in accordance with one embodiment of the present invention. As shown in FIG. 4A, leadfinger 410 comprises surface 412 which is exposed (e.g., not covered by material 220) to bottom surface 430 of package 210, thereby providing electrical access to leadfinger 410 from outside the package (e.g., 210). In contrast, leadfinger 420 as shown in FIG. 4B comprises surface 422 which is not exposed (e.g., covered by material 220) to bottom surface 430 of package 210, thereby reducing or eliminating electrical access to leadfinger 420 from outside the package (e.g., 210).

Leadfinger 420 may be formed by etching a larger leadfinger (e.g., 410) in one embodiment. As such, the portion (e.g., comprising surface 412) of the larger leadfinger (e.g., 410) that may be exposed from the bottom surface (e.g., 430) of the package (e.g., 210) may be etched to reduce the height of the leadfinger. The etched portion of the leadfinger may be filled by material 220, thereby covering surface 422 and limiting access to the leadfinger from bottom surface 430 of package 210. Additionally, in one embodiment, leadfinger 420 may comprise a half-etched leadfinger where height 427 is half the overall height (not depicted in FIG. 4B) of leadfinger 420.

Turning back to FIG. 3, portions of leadframe 100 may be accessible from the bottom of package 210, thereby enabling electrical testing (e.g., functional verification, etc.) of and/or heat dissipation from (e.g., by attaching a heatsink to exposed surfaces, by soldering or otherwise thermal coupling the exposed surfaces to a PCB or other circuit, etc.) components coupled to leadframe 100. For example, surface 340 of die paddle 140, surface 330 of die paddle 130, surfaces 320a-320b and 325a-325b of RMDP 120, surface 310 of FMDP 110, and surfaces 360 of internal leadfingers 160 may accessed for electrical testing (e.g., with a probe or other electrical testing instrument) and/or coupled to an object or material for dissipating heat from leadframe 100 and/or components coupled thereto. As such, unlike conventional laminate substrate or PCB-based assemblies, embodiments enable testing of one or more devices (e.g., a VCSEL die for emitting laser light used in optical sensor systems) coupled to portions (e.g., to die paddle 130) of leadframe 100. Further, in one embodiment, the exposed surfaces (e.g., 330 and 340) may enable electrical testing of the semiconductor devices without providing access to external leads (e.g., surfaces of selected leadfingers which would lie in areas 370 and 380, but are hidden by material 220 as shown in FIG. 3) of package 210.

Additionally, as shown in FIG. 3, surfaces 325a-325b may be etched or otherwise provided in leadframe 100 to reduce mold flash around surfaces 320a and 320b during molding of material 220. Similarly, dashed surfaces 315 may surround surface 310 to reduce mold flash during molding. As such, in one embodiment, reduction of mold flash around surfaces 310 and 320a-320b may enable the bottom surface (e.g., 430) of package 210 to sit more flush with a surface to which surfaces of package 210 (e.g., shown in FIG. 3) mate.

Although FIG. 3 depicts exposed surfaces with specific shapes and sizes, it should be appreciated that the exposed surfaces may comprise different shapes and/or sizes in other embodiments. Additionally, although a specific number of areas (e.g., 370 and 380) with hidden leadfinger surfaces are depicted in FIG. 3, it should be appreciated that a larger or smaller number of areas may be present in other embodiments. Further, it should be appreciated that a larger or smaller number of leadfinger surfaces may be hidden by such areas in other embodiments.

Figure 5:
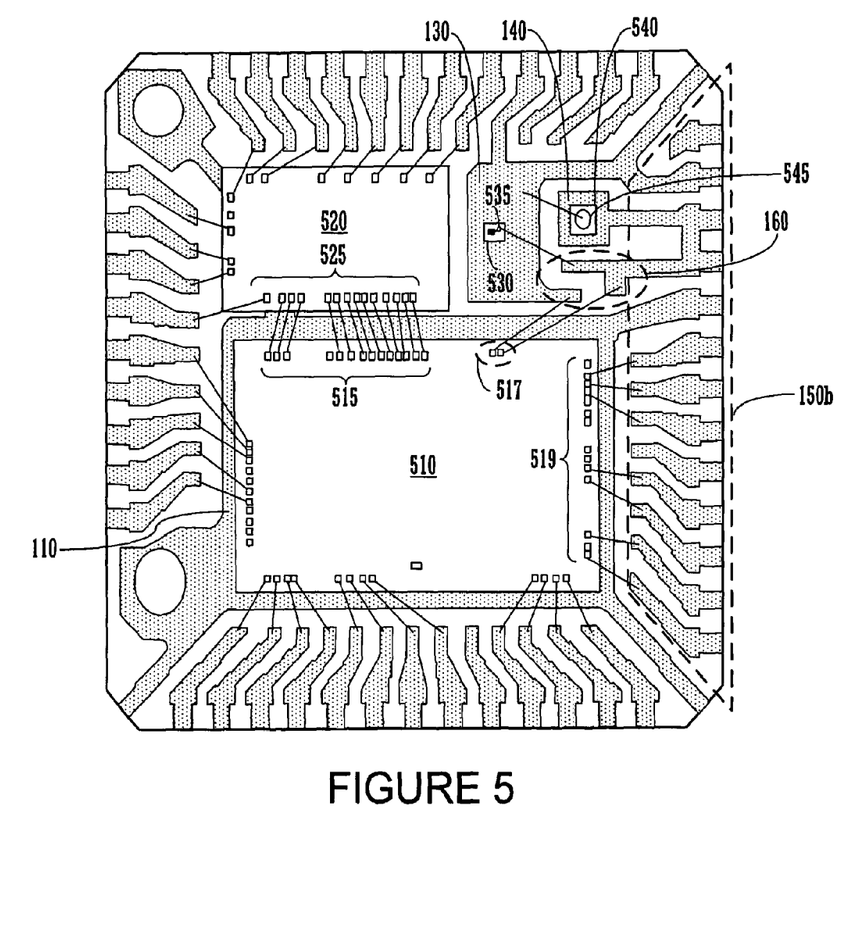
FIG. 5 shows an exemplary semiconductor device package with four semiconductor devices attached thereto in accordance with one embodiment of the present invention.

FIG. 5 shows exemplary semiconductor device package 210 with four semiconductor devices attached thereto in accordance with one embodiment of the present invention. As shown in FIG. 5, semiconductor device 510 is attached to FMDP 110, semiconductor device 520 is coupled to RMDP 120, semiconductor device 530 is attached to die paddle 130, and semiconductor device 540 is attached to die paddle 140. Additionally, conductive pads of each semiconductor device (e.g., 510-540) are shown electrically coupled (e.g., using wire bonding) to conductive pads of other semiconductor devices (e.g., as shown by conductive pads 515 of device 510 electrically coupled to conductive pads 525 of device 520), to die paddles (e.g., as shown by conductive pad 545 of device 540 electrically coupled to die paddle 130), or to leadfingers (e.g., as shown by conductive pads 535 and 517 electrically coupled to internal leadfingers 160, and also shown by conductive pads 519 of device 510 electrically coupled to peripheral leadfingers 150b).

In one embodiment, package 210 may form an integrated optical sensor system, which may be used in such products as optical mice. For example, device 530 may comprise a die (e.g., a VCSEL die) for emitting laser light, device 510 may comprise an analog die for sensing light reflected off a surface over which the optical mouse is moved, device 520 may comprise a digital die, and device 540 may comprise a diode (e.g., a zener diode) for protecting device 530 (e.g., from over-voltage conditions, over-current conditions, etc.). And as discussed above with respect to FIG. 1, device 510 may have a mounting surface area less than FMDP 110, and therefore not overhang FMDP 110. Conversely, device 520 may have a mounting surface area larger than RMDP 120, and therefore overhang RMDP 120. Thus, package 210 as depicted in FIG. 5 may provide an integrated optical sensor system with increased semiconductor device density, reduced size, reduced cost, and other enhanced features when compared with conventional solutions.

Although FIG. 5 shows a specific number, configuration and coupling of the conductive pads of each semiconductor device (e.g., 510-540), it should be appreciated that an alternative number, configuration or coupling of conductive pads may be used in other embodiments. Additionally, it should be appreciated that a different number, size, type, etc. of semiconductor devices may be coupled to package 210 in other embodiments.

Figure 6:
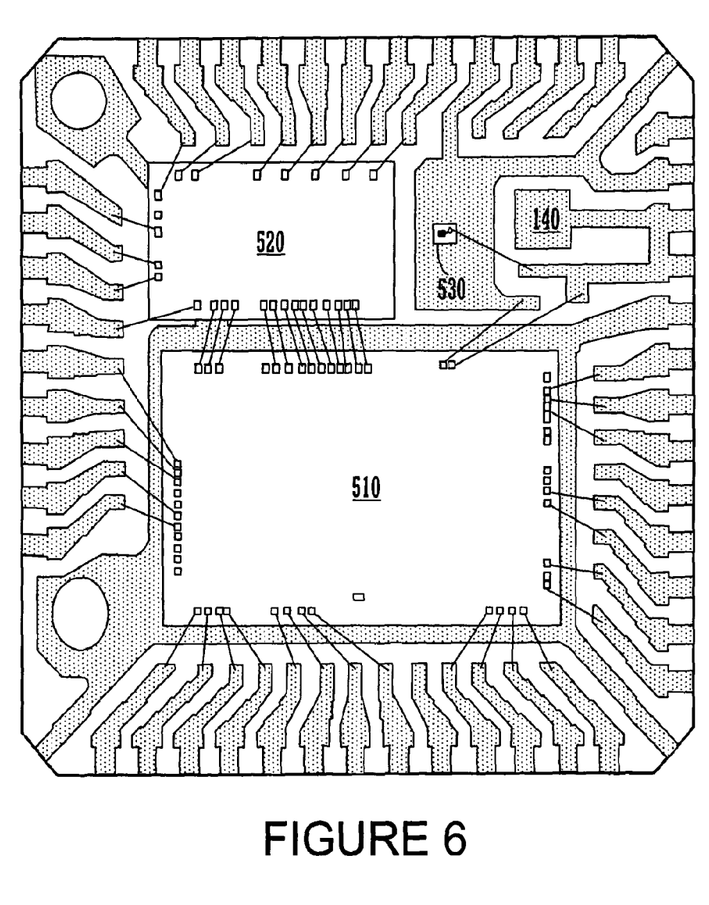
FIG. 6 shows an exemplary semiconductor device package with three semiconductor devices attached thereto in accordance with one embodiment of the present invention.

FIG. 6 shows exemplary semiconductor device package 210 with three semiconductor devices attached thereto in accordance with one embodiment of the present invention. As shown in FIG. 6, package 210 may be configured similarly to that depicted in FIG. 5. However, unlike package 210 as depicted in FIG. 5, die paddle 140 may be left vacant as shown in FIG. 6. As such, where package 210 as shown in FIG. 6 forms an integrated optical sensor system, diode 540 may be omitted to reduce product and assembly cost. Thus, like package 210 depicted in FIG. 5, package 210 as depicted in FIG. 6 may also provide an integrated optical sensor system with increased semiconductor device density, reduced size, reduced cost, and other enhanced features when compared with conventional solutions.

Figure 7:
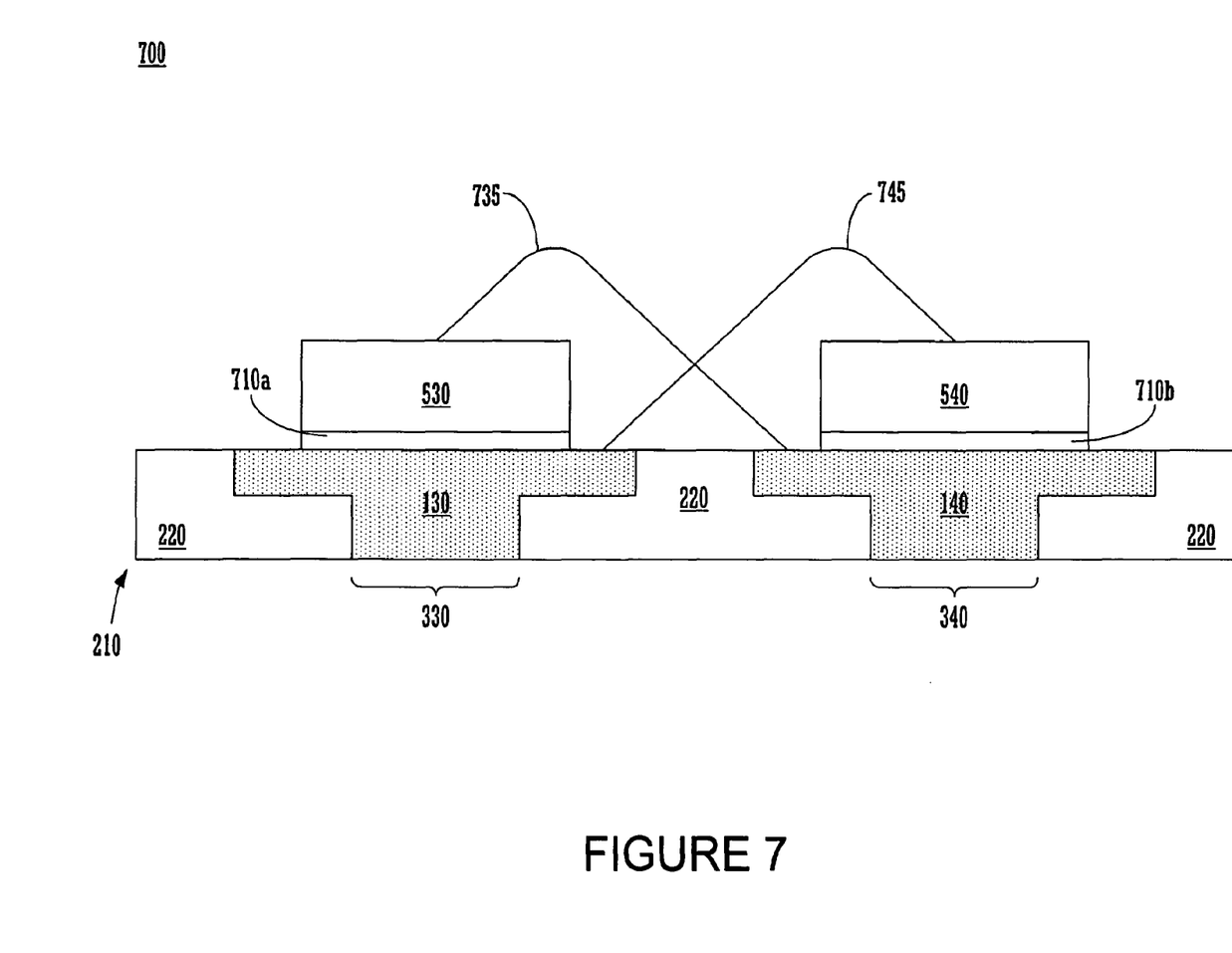
FIG. 7 shows a cross-sectional view of an exemplary semiconductor device package in accordance with one embodiment of the present invention.

FIG. 7 shows cross-sectional view 700 of exemplary semiconductor device package 210 in accordance with one embodiment of the present invention. As shown in FIG. 7, die paddles 130 and 140 are secured or fixed in material 220 to form package 210, where die paddles 130 and/or 140 may be etched or otherwise formed to increase the surface area in contact with material 220 and therefore increase adhesion with material 220 in one embodiment. Device 530 is coupled to die paddle 130 with die attach material 710a, whereas device 540 is coupled to die paddle 140 with die attach material 710b. Additionally, device 530 is electrically coupled to die paddle 140 by wire 735 (and/or any intervening conductive material such as traces, leads, leadfingers, etc.), while device 540 is electrically coupled to die paddle 130 by wire 745 (and/or any intervening conductive material such as traces, leads, leadfingers, etc.).

Where die attach material 710a is conductive, device 530 may be electrically coupled to both die paddles 130 and 140 to enable testing (e.g., formal verification, etc.) of device 530 from outside of package 210 (e.g., using surface 330 of die paddle 130 and surface 340 of die paddle 140). In this manner, surfaces 330 and 340 may be used as electrical probe points (e.g., where there is no access to external solderable leads). Similarly, where die attach material 710b is conductive, device 540 may be electrically coupled to both die paddles 130 and 140 to enable testing (e.g., formal verification, etc.) of device 540 from outside of package 210 (e.g., using surface 330 of die paddle 130 and surface 340 of die paddle 140).

In one embodiment, where device 530 comprises a VCSEL die for emitting laser light and device 540 comprises a zener diode for protecting device 530 (e.g., in a multi-die optical sensor system), surfaces 330 and 340 may provide electrical probe points for testing the VCSEL die and/or zener diode. The cathode of the VCSEL die (e.g., device 530) may be electrically coupled to die paddle 130 (e.g., where die attach material 710a is electrically-conductive) while the anode of the VCSEL die (e.g., device 530) is electrically coupled to die paddle 140 via wire 735. It should be appreciated that wire 735 may couple to die paddle 140 via one or more leadfingers, traces, etc. that are coupled to die paddle 140.

As discussed above with respect to FIG. 1, device 510 may have a mounting surface area less than FMDP 110, and therefore not overhang FMDP 110. Conversely, device 520 may have a mounting surface area larger than RMDP 120, and therefore overhang RMDP 120. Thus, package 210 as depicted in FIG. 5 may provide an integrated optical sensor system with increased semiconductor device density, reduced size, reduced cost, and other enhanced features when compared with conventional solutions.

Surfaces 330 and/or 340 may be used to dissipate heat from devices 530 and/or 540 in one embodiment. For example, material 710a and/or 710b may enable heat transfer from the devices to respective die paddles, where the heat may then be removed via surfaces 330 and/or 340. In one embodiment, one or more heatsinks may be coupled with surfaces 330 and/or 340. Alternatively, surfaces 330 and/or 340 may be soldered or otherwise coupled to PCB traces or other objects for removing heat from the die paddles.

Although die attach materials 710a and 710b have been described as conductive in one or more embodiments, it should be appreciated that materials 710a and/or 710b may be non-conductive in other embodiments. Additionally, although die paddles 130 and 140 and devices 530 and 540 are depicted with specific shapes, sizes, and orientations, it should be appreciated that other shapes, sizes, and orientations may be used in other embodiments. It should also be appreciated that other coupling means (e.g., mechanical, etc.) may be used to couple devices 530 and 540 to die paddles 130 and 140 in other embodiments.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. An apparatus comprising:
    a full-metal die paddle comprising a mounting surface to accept a first semiconductor device, wherein a surface area of the full-metal die paddle mounting surface is larger than a surface area of a mounting surface of the first semiconductor die;

a reduced-metal die paddle comprising a mounting surface to accept a second semiconductor device, wherein a surface area of the reduced-metal die paddle mounting surface is smaller than a surface area of a mounting surface of the second semiconductor die;

a frame having a perimeter around the full-metal die paddle and the reduced-metal die paddle;

a plurality of leadfingers extending inward from the frame; and wherein the full-metal die paddle mounting surface and the reduced-metal die paddle mounting surface are coplanar in a first plane and directly adjoined in the first plane by a straight member of the leadframe extending between the full-metal die paddle mounting surface and the reduced-metal die paddle mounting surface to form a unified die paddle.

2. The apparatus of claim 1, wherein the surface area of the reduced-metal die paddle mounting surface is smaller than the surface area of the mounting surface of the first semiconductor device.

3. The apparatus of claim 1, wherein the reduced-metal die paddle mounting surface comprises a plurality of adjoining circular portions.

4. The apparatus of claim 1 further comprising:
at least one additional die paddle comprising a mounting surface to accept an additional semiconductor device and a second surface to perform electrical testing of the additional semiconductor device.

5. The apparatus of claim 1, wherein the full-metal die paddle comprises a surface to provide heat dissipation from the first semiconductor device.

6. The apparatus of claim 1, wherein at least one of the plurality of leadfingers comprises:
a first surface to couple to a semiconductor device; and
a second surface opposing the first surface and to provide electrical access to the leadfinger from outside of a semiconductor device package incorporating the leadframe.

7. The apparatus of claim 1, wherein at least one of the plurality of leadfingers comprises:
a first surface to couple to a semiconductor device; and
a second surface opposing the first surface, wherein the second surface is etched to limit electrical access to the leadfinger from outside of a semiconductor device package incorporating the leadframe.

8. A multi-die semiconductor device package comprising:
a leadframe comprising:
a full-metal die paddle comprising a mounting surface;
a reduced-metal die paddle comprising a mounting surface; and
a frame having a perimeter around the full-metal die paddle and the reduced-metal die paddle;
a plurality of leadfingers extending inward from the frame;
wherein the full-metal die paddle mounting surface and the reduced-metal die paddle mounting surface are coplanar in a first plane and directly adjoined in the first plane by a straight member of the leadframe extending between the full-metal die paddle mounting surface and the reduced-metal die paddle mounting surface to form a unified die paddle;
a first semiconductor device mounted on the full-metal die paddle mounting surface, wherein a surface area of the full-metal die paddle mounting surface is larger than a surface area of a mounting surface of the first semiconductor die; and
a second semiconductor device mounted on the reduced-metal die paddle mounting surface, wherein a surface area of the reduced-metal die paddle mounting surface is smaller than a surface area of a mounting surface of the second semiconductor die such that the second semiconductor device overhangs the reduced-metal die paddle mounting surface.

9. The multi-die semiconductor device package of claim 8, wherein the surface area of the reduced-metal die paddle mounting surface is smaller than the surface area of the mounting surface of the first semiconductor device.

10. The multi-die semiconductor device package of claim 8, wherein the reduced-metal die paddle mounting surface comprises a plurality of adjoining circular portions.

11. The multi-die semiconductor device package of claim 8, wherein the leadframe further comprises:
at least one additional die paddle comprising a mounting surface to accept an additional semiconductor device and a second surface to perform electrical testing of the additional semiconductor device.

12. The multi-die semiconductor device package of claim 11, wherein the additional semiconductor device is electrically coupled to at least two die paddles with respective surfaces to perform electrical testing of the additional semiconductor device.

13. The multi-die semiconductor device package of claim 8, wherein the full-metal die paddle comprises a surface to provide heat dissipation from the first semiconductor device.

14. The multi-die semiconductor device package of claim 8, wherein at least one of the plurality of leadfingers comprises:
a first surface to couple to a semiconductor device; and
a second surface opposing the first surface and to provide electrical access to the leadfinger from outside of the semiconductor device package.

15. The multi-die semiconductor device package of claim 8, wherein at least one of said plurality of leadfingers comprises:
a first surface to couple to a semiconductor device; and
a second surface opposing the first surface, wherein the second surface is etched to limit electrical access to the leadfinger from outside of the semiconductor device package.

* * * * *